US009385820B2

(12) United States Patent
Barabash et al.

(10) Patent No.: US 9,385,820 B2
(45) Date of Patent: Jul. 5, 2016

(54) VSWR ESTIMATION USING CORRELATION TO SUPPRESS EXTERNAL INTERFERENCE

(71) Applicant: Nokia Solutions and Networks Oy, Espoo (FI)

(72) Inventors: Darrell Barabash, Grapevine, TX (US); Russell Morris, Keller, TX (US)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 14/434,785

(22) PCT Filed: Oct. 12, 2012

(86) PCT No.: PCT/US2012/059880
§ 371 (c)(1),
(2) Date: Apr. 10, 2015

(87) PCT Pub. No.: WO2014/058432
PCT Pub. Date: Apr. 17, 2014

(65) Prior Publication Data
US 2015/0288461 A1    Oct. 8, 2015

(51) Int. Cl.
*H04W 24/06* (2009.01)
*H04B 17/10* (2015.01)
*H04B 1/04* (2006.01)
(Continued)

(52) U.S. Cl.
CPC .............. *H04B 17/101* (2015.01); *G01R 27/06* (2013.01); *H04B 1/0458* (2013.01); *H04B 1/0475* (2013.01); *H04B 17/103* (2015.01); *H04B 17/12* (2015.01); *H04W 24/06* (2013.01)

(58) Field of Classification Search
CPC ..... H04W 24/06; H04B 17/12; H04B 17/101; H04B 1/0475

USPC .......... 455/67.4, 226.1, 423.424, 124, 67.14, 455/423, 424, 67.11, 67.16; 343/703
See application file for complete search history.

(56) References Cited

U.S. PATENT DOCUMENTS

| 6,289,216 | B1 * | 9/2001 | Koh | ........................ | G01R 27/06 343/703 |
| 7,548,506 | B2 * | 6/2009 | Ma | ........................ | H04L 7/0008 370/208 |

(Continued)

OTHER PUBLICATIONS

A.A. Moulthrop et al.; Accurate Meaurement of Signals Close to the Noise Floor on a Spectrum Anaalyzer; Aerospace Report No. TR-0091 (6925-02)-2; Sep. 30, 1992; The Aerospace Corporation; Engineering and Technology Group; whole document (17 pages).

*Primary Examiner* — Sonny Trinh
(74) *Attorney, Agent, or Firm* — Harrington & Smith

(57) ABSTRACT

A method includes accessing sets of correlation values, each set corresponding to a correlation performed between a number of first samples and a same number of second samples. The sets of correlation values were determined by aligning the number of the first samples with selected second samples and sliding the number of first samples across the second samples to select different sets of the second samples. The first samples are samples of a forward signal transmitted over a cable/connector system to one or more antennas, and the second samples are samples of a reflected RF signal that comprises a reflected version of the forward signal. The method includes determining a maximum value from the plurality of sets of correlation values, and associating the maximum value with a return loss of the cable/connector system. Apparatus, computer programs, and program products are also disclosed.

20 Claims, 14 Drawing Sheets

(51) Int. Cl.
*G01R 27/06* (2006.01)
*H04B 17/12* (2015.01)

(56) References Cited

U.S. PATENT DOCUMENTS

| | | | |
|---|---|---|---|
| 7,865,145 B2* | 1/2011 | Neustadt | H04B 17/318 455/161.3 |
| 8,441,918 B2* | 5/2013 | Ma | H04L 7/0008 370/208 |
| 9,172,571 B2* | 10/2015 | Ma | H04L 7/0008 |
| 2002/0010907 A1 | 1/2002 | MacCormack | 717/2 |
| 2004/0203447 A1* | 10/2004 | Lee | H04B 17/0085 455/67.11 |
| 2007/0010216 A1 | 1/2007 | Neustadt et al. | 455/115.1 |
| 2007/0281654 A1* | 12/2007 | Choi | H04B 7/0857 455/277.1 |
| 2009/0253385 A1 | 10/2009 | Dent et al. | 455/83 |
| 2010/0217553 A1 | 8/2010 | Von Novak et al. | 702/65 |
| 2011/0148579 A1 | 6/2011 | Strzelcyk et al. | 340/10.1 |

* cited by examiner

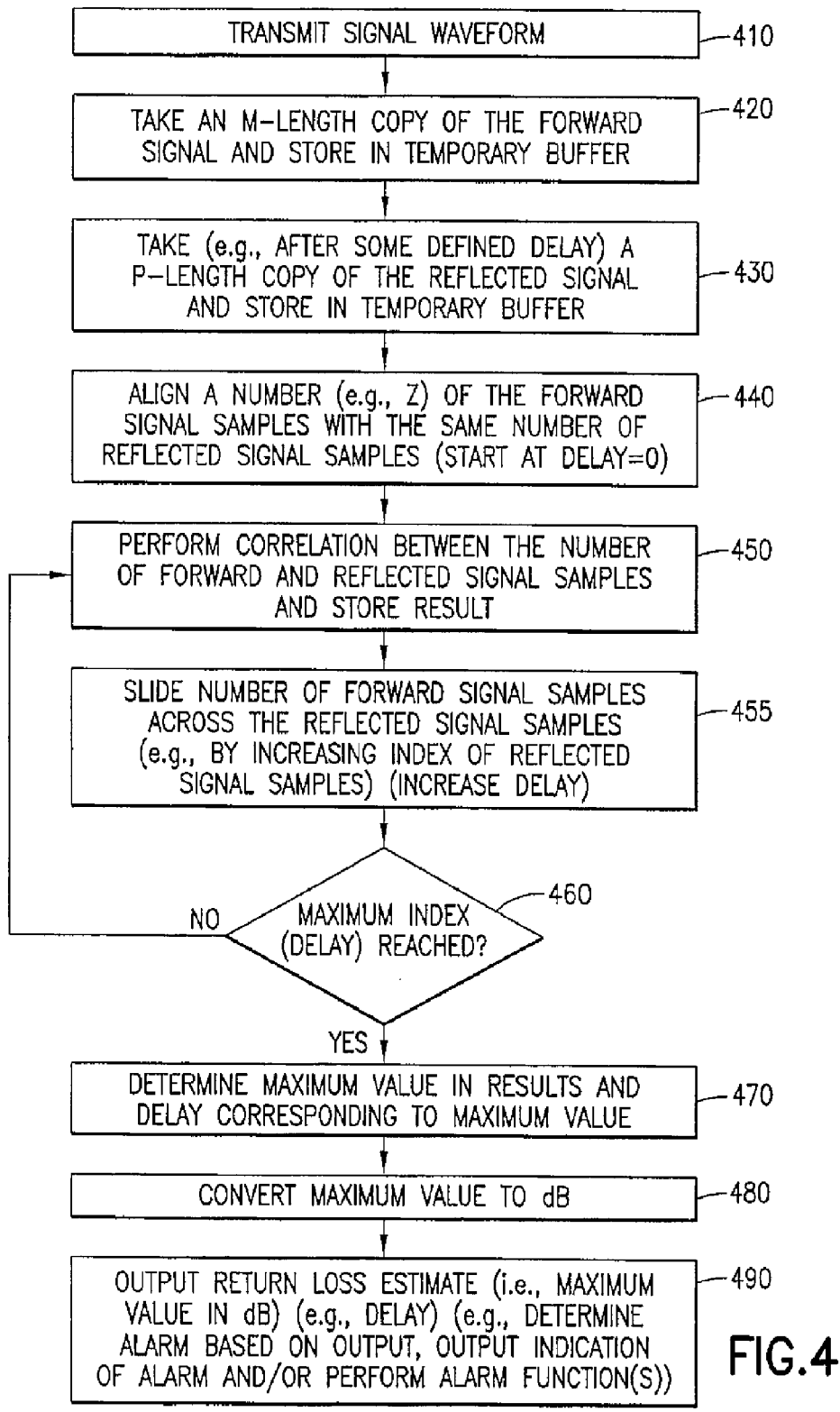

VSWR ESTIMATION USING CORRELATION TO SUPPRESS EXTERNAL INTERFERENCE

TECHNICAL FIELD

This invention relates generally to wireless transmissions and, more specifically, relates to antenna usage in wireless transmissions.

BACKGROUND

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section. Abbreviations that may be found in the specification and/or the drawing figures are defined below at the end of the specification but prior to the claims.

In a wireless transmission system, a transmitter is coupled to an antenna through a cable/connector system. Assuming an ideal transmission system, there will be no reflected power in a reflected signal (or, put another way, there is no reflected signal). That is, the transmission power in the "forward" signal is all applied through the cable/connector system to the antenna. Real transmission systems, however, have some reflected power in a reflected signal due to, e.g., impedance mismatch somewhere in the cable/connector system or antenna.

Cellular operators need a way to monitor, in real-time, the condition of the antenna and its cable/connector system. The accepted indicator of this quality is the VSWR or, equivalently, the return loss. Return loss is the ratio of the forward and reflected powers, converted to dB. Most commonly, directional couplers, bridges or circulators are used to separate the two power signals (forward and reflected power signals) followed by detectors to quantify their respective amplitudes. While the forward signal tends to be quite pure, the reflected signal is returning from the antenna and may be accompanied by extraneous energy, e.g., "noise".

Recent advances in complex modulation, multiple carriers and especially co-siting can make the task of monitoring the condition of the antenna and its cable/connector system more difficult than in the past. As an example for complex modulation and multiple carriers, typically, the log detectors used for this are not true power detectors (i.e., do not calculate true root-mean-squared power or measure heating in a load, or the like) so the result depends on the nature of the signal. For example, between a single CW carrier and a wideband CDMA or an LTE carrier (which resembles Gaussian noise), all at the same output power, the detector output could vary up to as much as about 5 dB. As one example, the "noise" in the reflected signal may be due to other transmitters electrically combined with the desired transmitter or from co-sited transmitters coupling in through the antenna. Either way, a reflection detector will report more power than the reflection itself is producing, resulting in a lower return loss which may cause a false alarm. That is, since the return loss is a ratio of the forward and reflected powers, anything that erroneously increases the reported reflective power will decrease the return loss (assuming the forward power is stable), and an alarm can be reported due to the artificially reduced return loss.

It would be beneficial to improve monitoring the condition of the antenna and its cable/connector system.

SUMMARY

This section contains examples of possible implementations and is not meant to be limiting.

An exemplary embodiment is a method, comprising accessing a plurality of sets of correlation values. Each set of correlation values corresponds to a correlation performed between a number of first samples and a same number of second samples. The sets of correlation values were determined by aligning the number of the first samples with a selected set of the second samples and then sliding the number of first samples across the second samples to select different sets of the second samples. The first samples are samples of a forward signal transmitted over a cable/connector system to one or more antennas, and the second samples are samples of a reflected radio frequency signal that comprises a reflected version of the forward signal. The method includes determining a maximum value from the plurality of sets of correlation values, and associating the maximum value with a return loss of the cable/connector system.

Another exemplary embodiment is a computer program product comprising program code for executing the method according to the previous paragraph. A further exemplary embodiment is the computer program according to this paragraph, wherein the computer program is a computer program product comprising a computer-readable medium bearing computer program code embodied therein for use with a computer.

An additional exemplary embodiment is an apparatus comprising a memory comprising a plurality of sets of correlation values. Each set of correlation values corresponds to a correlation performed between a number of first samples and a same number of second samples. The sets of correlation values were determined by aligning the number of the first samples with a selected set of the second samples and then sliding the number of first samples across the second samples to select different sets of the second samples. The first samples are samples of a forward signal transmitted over a cable/connector system to one or more antennas, and the second samples are samples of a reflected radio frequency signal that comprises a reflected version of the forward signal. The apparatus includes circuitry configured to perform at least the following: determining a maximum value from the plurality of sets of correlation values; and associating the maximum value with a return loss of the cable/connector system. The circuitry may comprise one or more processors. A further exemplary embodiment is at least one integrated circuit comprising the apparatus of this paragraph. Another exemplary embodiment is a base station comprising the apparatus of this paragraph.

Another exemplary embodiment is an apparatus, comprising means for storing plurality of sets of correlation values, each set of correlation values corresponding to a correlation performed between a number of first samples and a same number of second samples, the sets of correlation values determined by aligning the number of the first samples with a selected set of the second samples and then sliding the number of first samples across the second samples to select different sets of the second samples, wherein the first samples are samples of a forward signal transmitted over a cable/connector system to one or more antennas, the second samples are samples of a reflected radio frequency signal that comprises a reflected version of the forward signal. The apparatus further comprises means for determining a maximum value from the plurality of sets of correlation values, and means for associating the maximum value with a return loss of the cable/connector system. A further exemplary embodiment is at least one integrated circuit comprising the apparatus of this paragraph. Another exemplary embodiment is a base station comprising the apparatus of this paragraph.

BRIEF DESCRIPTION OF THE DRAWINGS

In the attached Drawing Figures:

FIG. 4 is a block diagram of an exemplary logic flow diagram that illustrates the operation of an exemplary method, a result of execution of computer program instructions embodied on a computer readable memory, and/or functions performed by logic implemented in hardware, in accordance with exemplary embodiments of this invention;

DETAILED DESCRIPTION OF THE DRAWINGS

Figure 1:
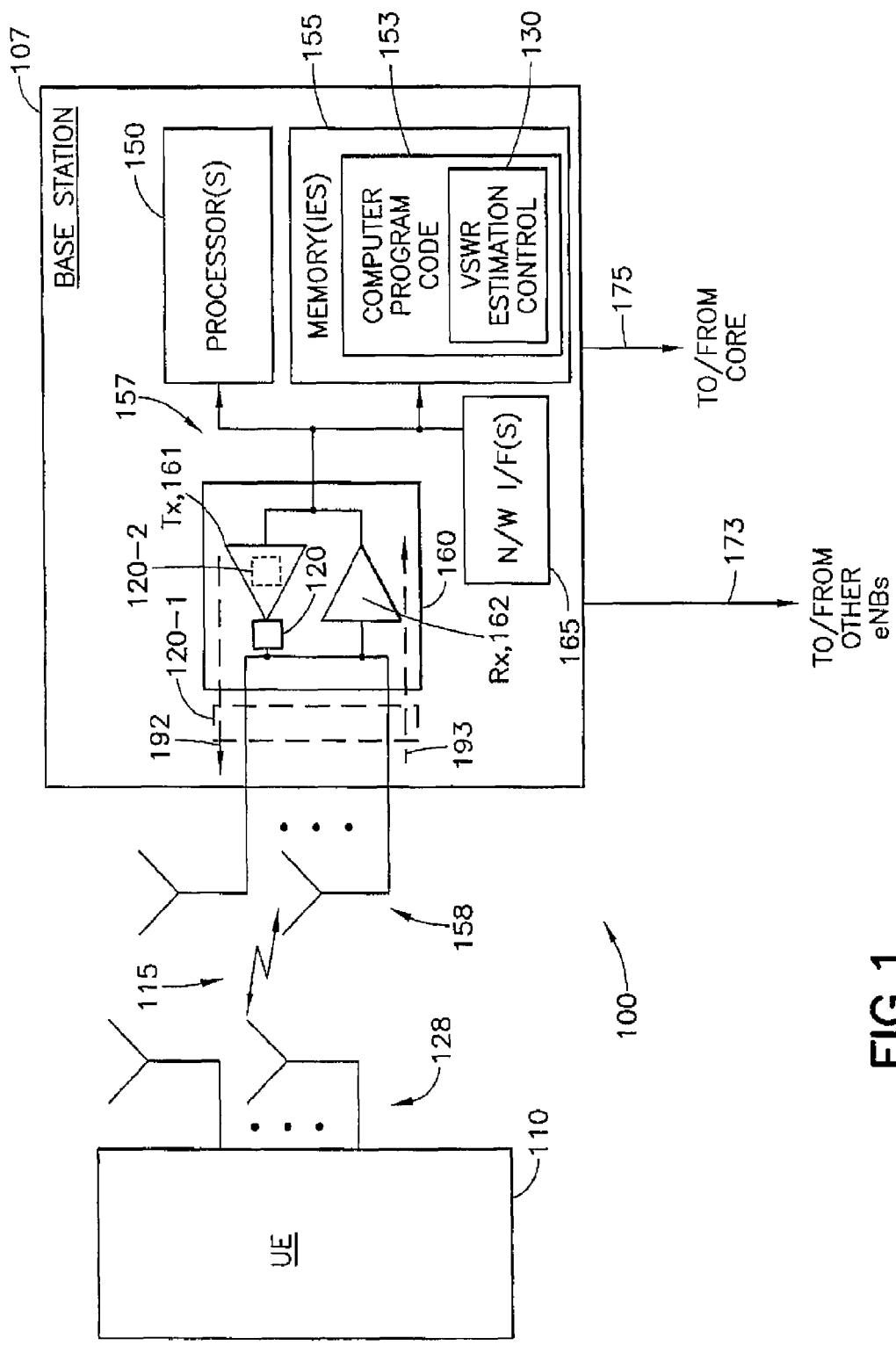
FIG. 1 illustrates an exemplary system in which the exemplary embodiments of the instant invention may be practiced.

Before proceeding with description of additional problems with conventional systems and how exemplary embodiments address these problems, reference is now made to FIG. 1, which illustrates an exemplary system in which the exemplary embodiments of the instant invention may be practiced. In FIG. 1, a user equipment (UE) 110 is in wireless communication with a wireless network 100 via a wireless link 115 with base station 107 (such as an eNB or NodeB), which is an LIE base station (in this example) providing access to and from the wireless network 100. The user equipment 110 includes one or more antennas 128.

The network 100 includes a base station 107. Although an LTE base station is used herein as an example, the exemplary embodiments are applicable to any wireless transmission system. The base station 107 includes one or more processors 150, one or more memories 155, one or more network interfaces (N/W I/F(s)) 165, and one or more transceivers 160 (each comprising a transmitter, Tx, 161 and a receiver, Rx, 162) interconnected through one or more buses 157. In the transmitter 161, a VSWR estimation apparatus 120 is used to perform VSWR estimation in accordance with exemplary embodiments of the instant invention. The location, as indicated by reference 120, of the VSWR estimation apparatus is merely exemplary. Portions 120-1 of the VSWR estimation apparatus 120 may be included after the Rx and Tx antenna paths are combined (as shown by reference 120-1), or portions 120-2 may be implemented in the transmitter 161. There are multiple locations in a transmission path 192 (and also in part of the reception path 193) where some or all of the VSWR estimation apparatus 120 may reside. The one or more transceivers 160 are connected to one or more antennas 158. The one or more memories 155 include computer program code 153, which in this example comprises VSWR estimation control functionality 130, which may partially or completely perform and/or control VSWR estimation. The one or more memories 155 and the computer program code 153 are configured to, with the one or more processors 150, cause the base station 107 to perform one or more of the operations as described herein. The VSWR estimation control functionality 130 may be implemented in the computer program code 153 (executed by the one or more processors 150), or implemented in hardware such as logic in an integrated circuit as described below, or as some combination of computer program code and hardware.

The one or more network interfaces 165 communicate over networks such as the networks 173, 175. The base station 107 may communicate with other base stations using, e.g., network 173. The network 173 may be wired or wireless or both and may implement, e.g., an X2 interface. The base station 107 may use the network 175 to communicate with a core portion of the wireless network 100.

The computer readable memory 155 may be of any type suitable to the local technical environment and may be implemented using any suitable data storage technology, such as semiconductor based memory devices, flash memory, magnetic memory devices and systems, optical memory devices and systems, fixed memory and removable memory. The processor(s) 150 may be of any type suitable to the local technical environment, and may include one or more of general purpose computers, special purpose computers, general or special purpose integrated circuits, microprocessors, digital signal processors (DSPs) and processors based on a multi-core processor architecture, as non-limiting examples.

Figure 2:
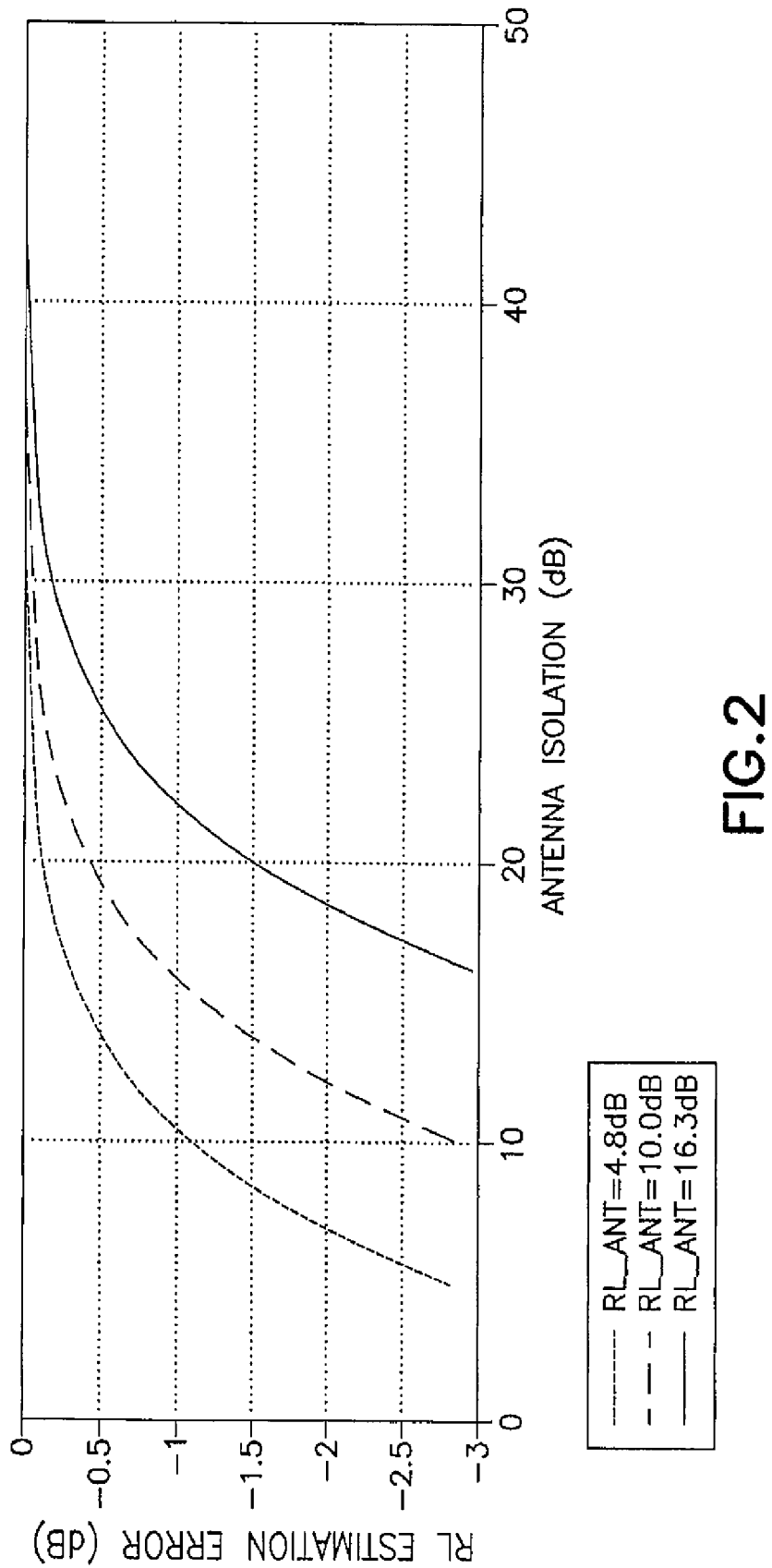
FIG. 2 is a chart of measurement error versus isolation.

As stated above, there could be noise in a reflected signal that causes a reflection detector to report more power than the reflection itself is producing, resulting in a lower return loss which may cause a false alarm. In order to obtain adequate accuracy, it is generally necessary to suppress the interfering signals by roughly 25 dB or more. But, depending on the tolerable error (see the RL, Return Loss, Estimation Error), the isolation could be more or less as shown in FIG. 2. The "RL_ANT" are return losses of the antenna system. The required isolation is usually obtained through some combination of power level in order to determine at least the second samples.

embodiments disclosed herein are capable of minimizing or even eliminating the means normally taken to maintain adequate isolation. For instance, exemplary techniques disclosed herein provide discrimination between the reflections of the signal that are emanating from the desired transmitter versus interference that couples in from other sources (e.g., a transmitter co-sited with the transmitter that transmits the original signal and receives the reflected signal).

Figure 3A:
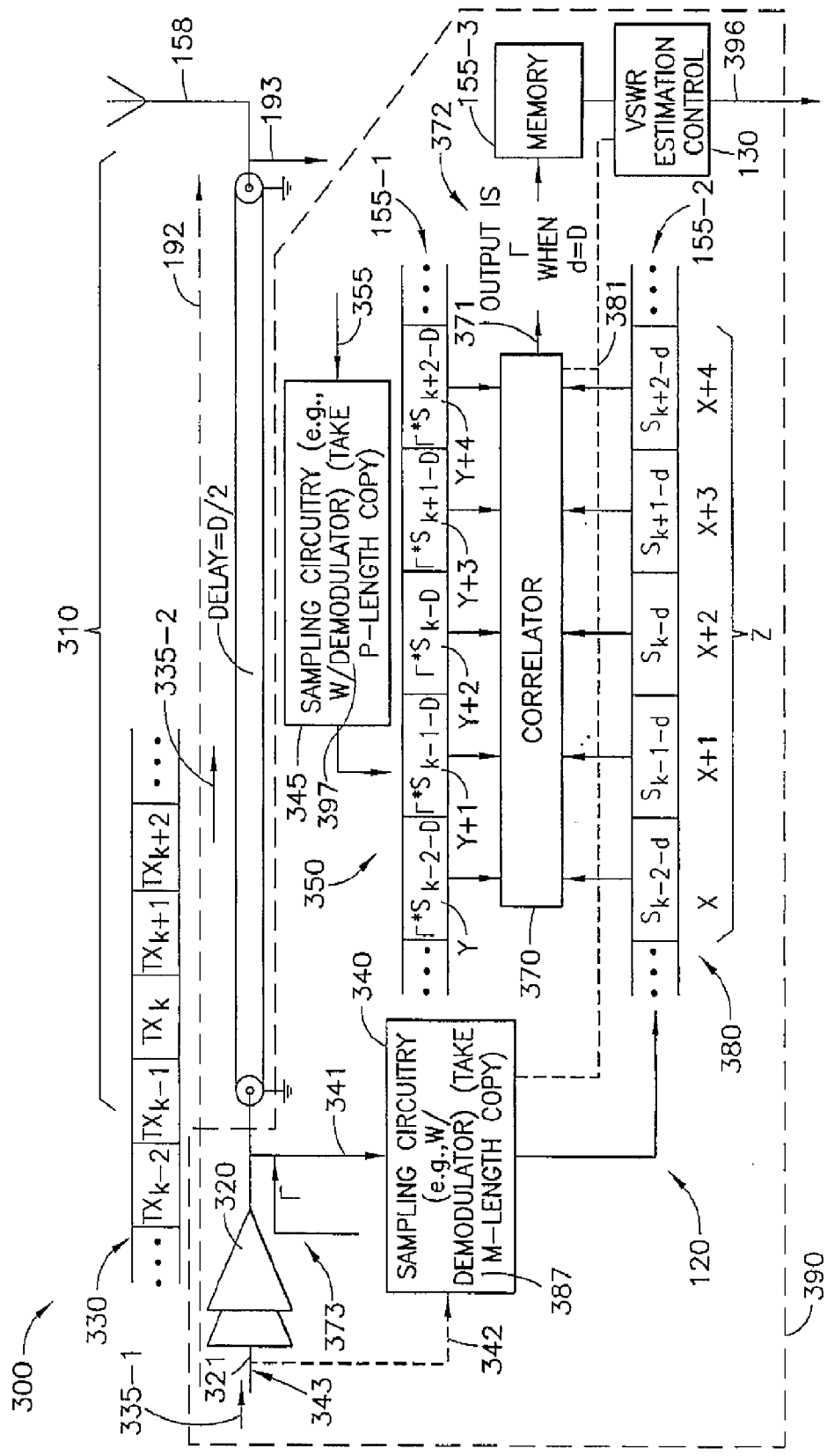
FIG. 3A is a block diagram of a portion of a transmitter including (a portion of) an exemplary VSWR apparatus.

Turning to FIG. 3A, a block diagram is shown of a portion 300 of a transmitter 161, including an exemplary VSWR apparatus 120. It should be noted that FIG. 3A, for simplicity, concentrates on the transmission path and does not show the reception path (see FIG. 1 from the antenna(s) 158 to the receiver, Rx, 162). However, this not to be construed as limiting. The portion 300 includes one or more power amplifiers 320 coupled to a cable/connector system 310, which is coupled to the antenna 158. The delay caused by the cable/connector system 310 is D/2 in this simple example. The VSWR apparatus 120 includes in this example sampling circuitries 340 and 345, buffers 155-1 and 155-2, memory 155-3, a correlator 370, and VSWR estimation control functionality 130. In this example, the one or more power amplifiers 320 and the VSWR estimation apparatus 120 are implemented in an integrated circuit (IC) 390, such as an application-specific integrated circuit (ASIC). The VSWR estimation control functionality 130 therefore may be implemented as logic in the IC 390. However, some or all of the VSWR estimation control functionality 130 may be implemented in computer program code 153 (e.g., stored as firmware/software in memory 155, see FIG. 1) and executed by a processor 150, e.g., formed as part of the IC 390.

It should be noted that although only one ASIC is shown, there may be multiple ASICs or other hardware elements. For instance, the sampling circuitry 340 could be implemented by one ASIC, the sampling circuitry 345 could be implemented by another ASIC, and the memories 155, correlator 370, and VSWR estimation control 130 implemented by a third ASIC. Furthermore, aspects of the embodiments may be performed by hardware, software (executed by hardware), or some combination. This is really an implementation detail, trading off items like cost, space, VSWR reporting speed, and the like, but the general approach is independent of this.

The operation of the portion 300 of the transmitter 161 and of the VSWR apparatus 120 is described in relation to FIG. 3A and also in relation to FIG. 4. FIG. 4 is a block diagram of an exemplary logic flow diagram that illustrates the operation of an exemplary method, a result of execution of computer program instructions embodied on a computer readable memory, and/or functions performed by logic implemented in hardware, in accordance with exemplary embodiments of this invention.

In an exemplary embodiment of the instant invention, rather than using individual forward and reflected signal power detectors, a sampled version (e.g., set 380 of samples) of the composite transmitted signal waveform 330 is correlated with a sampled and delayed version (e.g., set 350 of samples) of the reflected signal waveform. The delay, d, is varied from, in an exemplary embodiment, zero to the longest delay (e.g., $W_{Max}$) expected which is in the order of 1.5 µsec (microseconds) for a typical base station site. The longest delay expected may be 2×ANT_cable_length/velocity_of_propagation, where ANT_cable_length is the antenna cable length and velocity_of_propagation is the velocity of propagation in the cable for a particular example that considers only the cable/connector system 310. However, as described below, this is merely an example and the longest delay may be dramatically different from the formula just presented. A forward signal is aligned with a reflected signal, the correlation is calculated, the forward signal is slid relative to the reflected signal, correlation is calculated, and this process continues until the forward signal is slid by some amount relative to the reflected signal. The maximum value in the set of correlations is found and is, e.g., converted to dB. The maximum value represents the best estimate of the return loss and the delay (at the point of the maximum value) represents the time and therefore the distance to the reflection. Any component of the reflected signal that is not just a scaled version of the transmitted signal does not contribute to the correlation and is thus suppressed.

The example of FIG. 3A uses a sampling point 341 for at least the sampling of the forward signal. Thus, the indicated delay, D, is for the cable/connector system 310. However, this is merely exemplary, and the sampling of at least the forward signal 335 could occur at many different locations in the transmission path 192, e.g., at location 342, prior to the one or more power amplifiers 320 and as such can occur in the baseband 343. This is indicated by reference 335-1, which is a baseband version of the forward signal 335 that is transmitted. For this example, the sampling occurs without use of the demodulator 387. In this case, the transmission path 192 can start in the baseband 343 and conclude in the antenna(s) 158. Furthermore, in this case, the delay D can be quite large and include time delays for the power amplifier(s) 320, filters (not shown) if used, and other electronics.

Figure 3B:
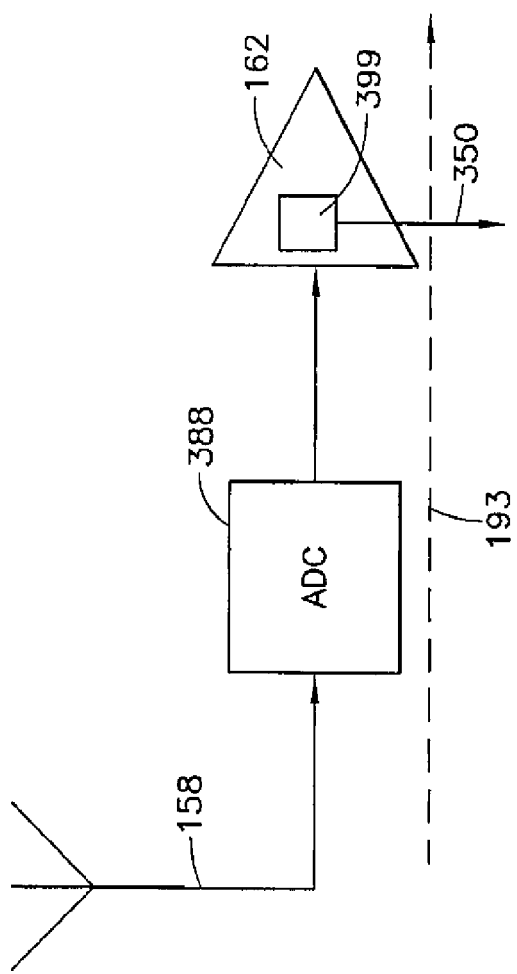
FIG. 3B is a block diagram of a portion of a reception path used as a portion of an exemplary VSWR apparatus.

In terms of using the exemplary sampling point 314, a signal waveform on the input 321 is transmitted (block 410 of FIG. 4) by the one or more power amplifiers 320. A version of the amplified radio frequency signal waveform is shown as 330, which includes many symbols (in this example), a portion of which is shown as " ... $TX_{k-2}$, $TX_{k-1}$, $TX_k$, $TX_{k+1}$, $TX_{k+2}$ ... ", and a radio frequency version of the forward signal is illustrated by reference 335-2. The forward RF signal 335-2 is sampled at a particular sampling rate (e.g., in megasamples per second, Msps) by the sampling circuitry 340, where in one example the sampling occurs after demodulation by the demodulator 387. The set 380 of samples includes in this example M samples, a portion of which is shown as " ... $S_{k-2-d}$, $S_{k-1-d}$, $S_{k-d}$, $S_{k+1-d}$, $S_{k+2-d}$ ... ", where each S is a symbol corresponding to a symbol TX in the amplified waveform 330. To compute the correlation, a fixed length (e.g., M-length) set 380 of samples of the transmitted forward RF signal 335-2 is taken and stored in, e.g., a temporary buffer 155-1 (block 420 of FIG. 4). Then, e.g., after some defined delay from the start of this buffering operation (e.g., the first of the M samples or some other reference point), another fixed length (e.g., P-length) set 350 of samples of the reflected waveform 355 is taken (block 430) by the sampling circuitry 345 (block 430 of FIG. 4, which includes a demodulator 397 from which the samples 350 are generated) and is stored (block 430) in, e.g., another temporary buffer 155-2 (although it should be noted the two buffers 155-1 and 155-2 could be a single large buffer). The set 350 of samples includes in this example P samples, a portion of which is shown as " ... $\Gamma S_{k-2-D}$, $\Gamma S_{k-1-D}$, $\Gamma S_{k-D}$, $\Gamma S_{k+1-D}$, $\Gamma S_{k+2-D}$ ... ", where $\Gamma$ is the reflection coefficient and each S is a symbol corresponding to a symbol TX in the amplified waveform 330. It is noted that the sampling circuitry 345 may occur before or after Rx and Tx paths are combined or at other locations in the Tx path. In particular, one possibility is shown in FIG. 3B, which shows a block diagram of a portion of a reception path 193 used as a portion of an exemplary VSWR apparatus. In this example the portion includes an ADC (analog-to-digital converter 388) and part of the receiver 162, including at least a demodulator 399, which produces the set 350 of samples. It is noted that typically P will be greater than or equal to M, although this is not a limitation.

A sample by sample correlation against the reflected signal waveform is performed by the correlator 370, which in an example is a set of logic operations implemented in the IC 390 (or may be performed by software executed by hardware, or both). In one example, the correlator 370 starts at one end of a "delay" range (e.g., delay=0) in (one possible) block 440 ("Start at delay=0") and the cross correlator 370 performs correlation (block 450) between the forward waveform in the set 380 of samples and the reflected waveform in the set 350 of samples. Correlation may be defined as follows:

$$CC[k] = \sum_{d=0}^{d_{Max}} f^*[k]g[k-d],$$

where CC[k] is a correlation result 371, the "*" denotes complex conjugation, ƒ[k] is the set 350 of samples, and g[k] is the set 380 of samples. Each CC[k] has a set of M correlation coefficient values, and there will be $d_{Max}+1$ sets of results 371 in this example.

The final result 371 is stored (block 450; the storage may be to memory 155-3), the delay, d, is modified (e.g., incremented) in block 455, and the measurement performed again and repeatedly until the entire "delay" range (e.g., from d=0 to $d=d_{Max}$) has been covered. More particularly, in block 460, it is determined if the delay is at the other end of the delay range (e.g., $d=d_{Max}$). If not (block 460=No), correlation is performed by the correlator 370 again (block 450). A maximum search of the results 371 stored in memory 155-3 then yields the return loss estimate.

The use of a delay and a delay range is one example, but since the memories 155-1 and 155-2 may be implemented using indices such as those used in circular buffers or other buffers, the calculations may be performed using indices instead (where an index can be converted to a delay). Furthermore, it will typically be the case that a number Z, of the M samples will be used to compare with a number Z of the P samples. FIG. 3A therefore also illustrates that a number Z of five (in this example, typically Z will be much higher, such as 128 or more samples) samples in the set 380 having indices X through X+4 are aligned (block 440) with the number Z of five samples in the set 350 having indices Y through Y+4. A correlation is performed and the result is stored (block 450). The number, Z, of samples in the set 380 is slid across the samples in set 350 (block 455). If a maximum index (for the samples in the set 350) is not reached (block 455=No), another correlation is performed in block 450. The correlation formula from before may be used, where ƒ[k] is a number Z from the set 350 of samples, and g[k] is a number Z from the set 380 of samples, the ƒ[k] is slid relative to g[k] for each correlation, and $d_{Max}$ is $Y_{Max}-1$. Each CC[k] has a set of Z correlation coefficient values, and there will be $d_{Max}+1$ (i.e., $Y_{Max}$) sets of results 371 in this example. Furthermore, since each index (X or Y) corresponds to a sample period, the indices corresponding to and can be converted to delays.

For instance a first correlation after alignment in block 440 is performed using X to X+4 samples of the set 380 and Y to Y+4 samples of the set 350. The next correlation is performed using X to X+4 samples of the set 380 and Y+1 to Y+5 samples of the set 350 (i.e., the X to X+4 samples of the set 380 are slid to Y+1 to Y+5 samples of the set 350). The next correlation is performed using X to X+4 samples of the set 380 and Y+2 to Y+6 samples of the set 350 (i.e., the X to X+4 samples of the set 380 are slid to Y+2 to Y+6 samples of the set 350). This continues until the final correlation is performed using X to X+4 samples of the set 380 and $Y+Y_{Max-Z}$ to $Y+Y_{Max}$ samples of the set 350 (i.e., the X to X+4 samples of the set 380 are slid to $Y+Y_{Max-Z}$ to $Y+Y_{Max}$ samples of the set 350), where $Y_{Max}$ is the maximum index in the set 350. For instance, M and P could be 4096 (e.g., for a sample rate of 76.8 MHz), Z might be the first 128 samples (for instance), the alignment would start at both M, P=0, and end after the 128 samples have been slid by all of the 4096 samples in the P samples (e.g., $Y_{Max}=4096-128-1$).

If block 460=Yes, in block 470, the maximum value in the results 371 stored in 155-3 is determined, as is the delay corresponding to the maximum value. Determining the delay is optional. In block 480, the maximum value is converted to dB (e.g., using dB=20 log(maximum value)). It is noted that the process of performing the correlation may be performed to also determine the correlation values in dB and therefore block 470 would find the maximum value in dB. In block 490, the return loss estimate or an indication thereof (i.e., the maximum value in dB) is output as output 396, e.g., to one of the processors 150 (see FIG. 1). This may be used to determine (block 490) whether an alarm is suitable and, if so, to output (block 490), if desired, an indication of the alarm. Alternatively or in addition, one or more function(s) may be performed in response to the alarm (block 490).

It is noted that the examples above start at d=0 and end at $d=d_{Max}$. However, the reverse can be true, the starting point can be $d=d_{Max}$ and the ending point can be d=0. Furthermore, the set 380 of samples is delayed and the set 350 of samples is not in the examples. However, the opposite may also be true, the set 350 of samples may be delayed and the set 380 of samples may not be delayed. It is also noted that the sliding (see block 455) of the forward signal samples "across" the reflected signal samples is a "movement" of the forward signal samples relative to the reflected signal samples. That is, the reflected signal is effectively kept stationary while the forward signal is moved. In the example of FIG. 3A, this is done by increasing the Y index value relative to the number Z of samples in the set 380 of forward signal samples. However this could also be done by decreasing the Y index value relative to number Z of samples in the set 380 of forward signal samples. That is, X aligns with Y in the example above, then X aligns with Y+1 . . . ; it could also be the case that X aligns with Y, then X aligns with Y−1 . . . , so that the number Z of samples in the set 380 go "backwards" through the samples in the set 350.

As illustrated by reference 372, the output is Γ when d=D. Also, as illustrated by reference 373, the reflection coefficient F occurs looking outward from a beginning of the cable/connector system 310 toward the antenna 158.

In an example, the VSWR estimation control functionality 130 may cause the operations in blocks 420-490 to occur. For instance, the signal(s) 381 may be used by the VSWR estimation control functionality 130 to load the correlator 370 with a selected delay, d, and to modify or cause to be modified the delay, d. As another example, the signal(s) 381 may be used by the VSWR estimation control functionality 130 to cause the sampling circuitry 340 to take the samples at an appropriate time. In a further example, the sampling circuitry 340 is internally programmed to take the samples at the appropriate times, and the signal(s) 381 is/are used to inform the VSWR estimation control functionality 130 (and/or the correlator 370) that the temporary buffers 155-1, 155-2 are full. In an additional example, the cross correlator 370 performs the cross correlations automatically and outputs the results 371 to the memory 155-3 and the signal(s) 381 are used to inform the VSWR estimation control functionality 130 as to the completion of all the correlations. Still other embodiments are possible, and the examples presented here should not be construed as being limiting.

Figure 5A:
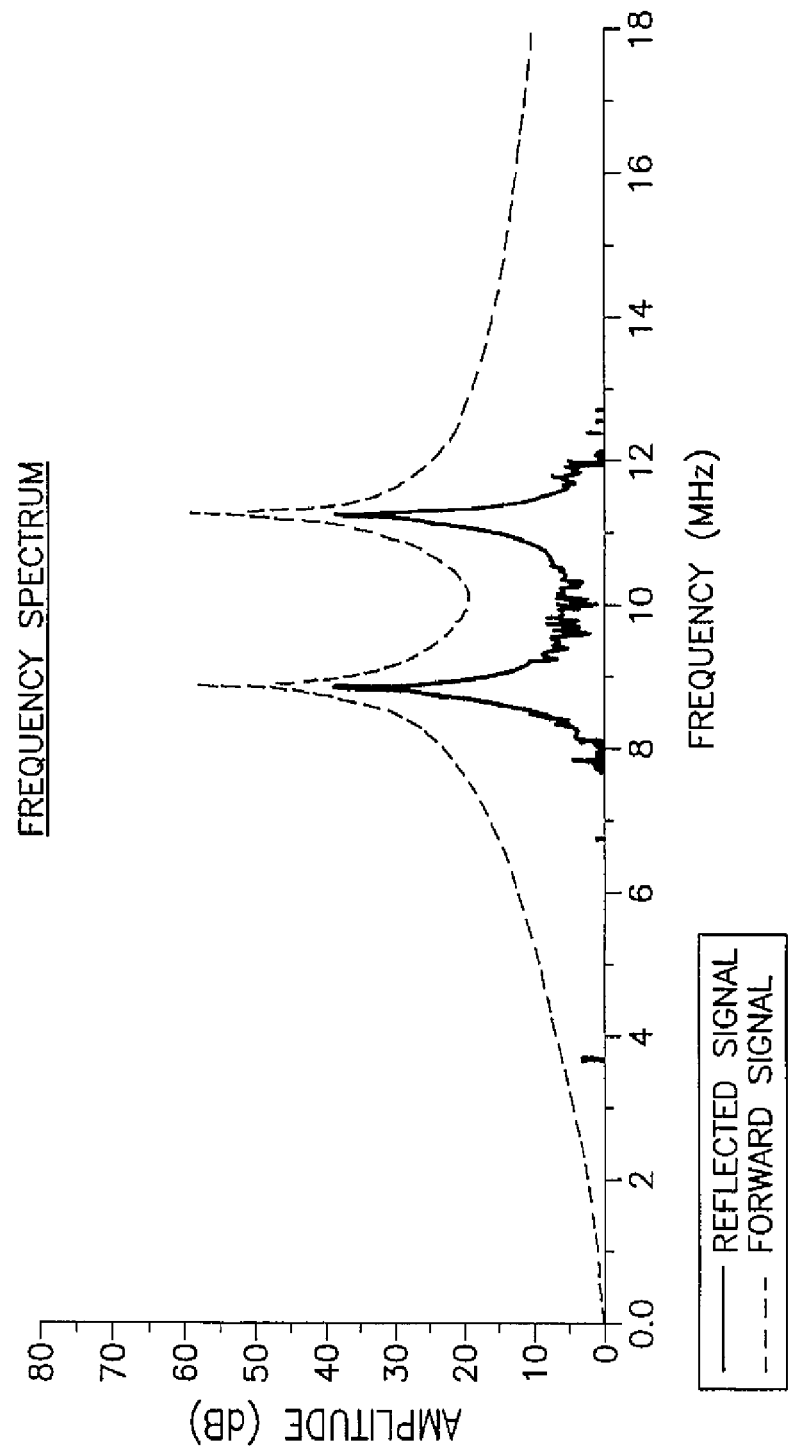
FIG. 5A is a frequency spectrum chart and FIG. 5B is a time domain chart of forward and reflected signals for a 20 dB antenna load without interference.
Figure 5B:
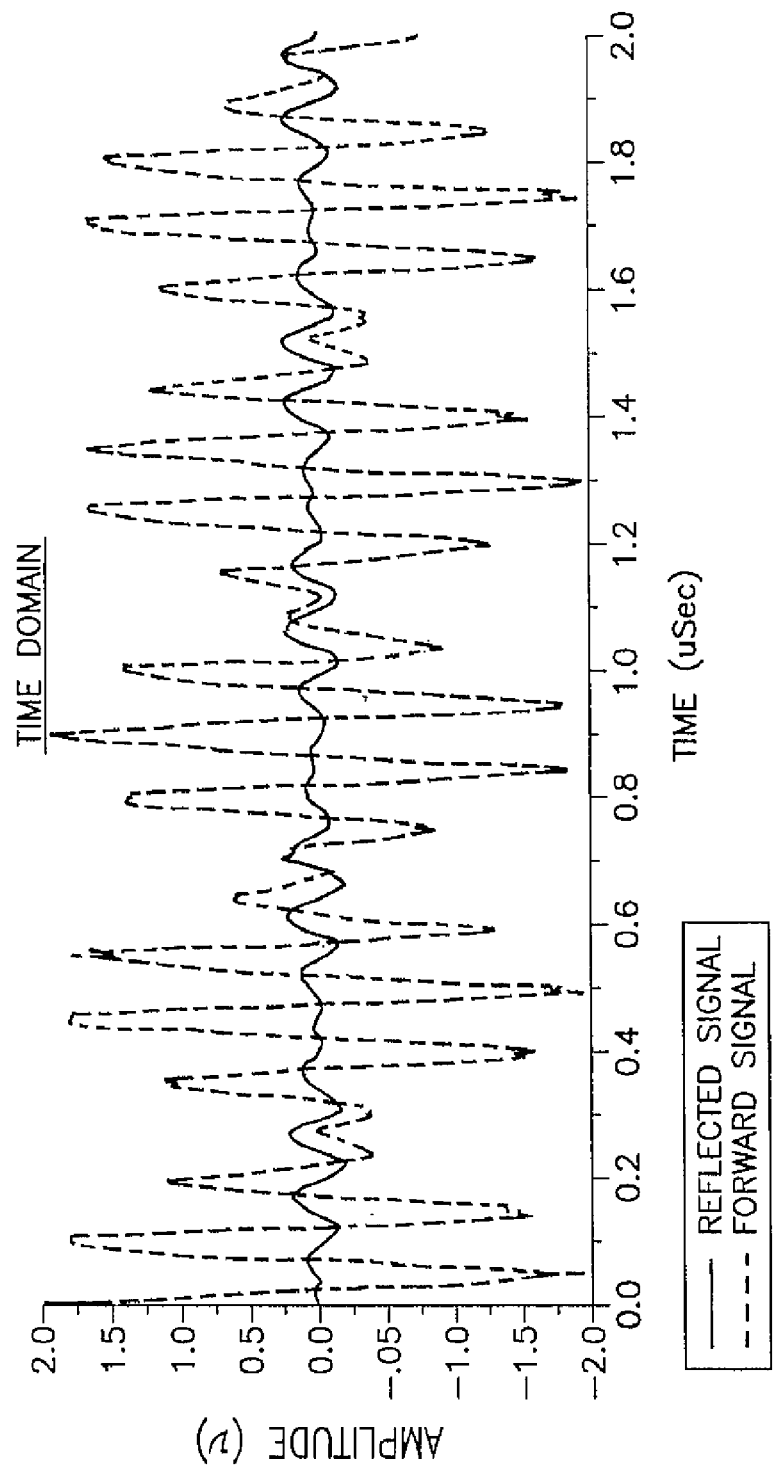
Figure 5C:
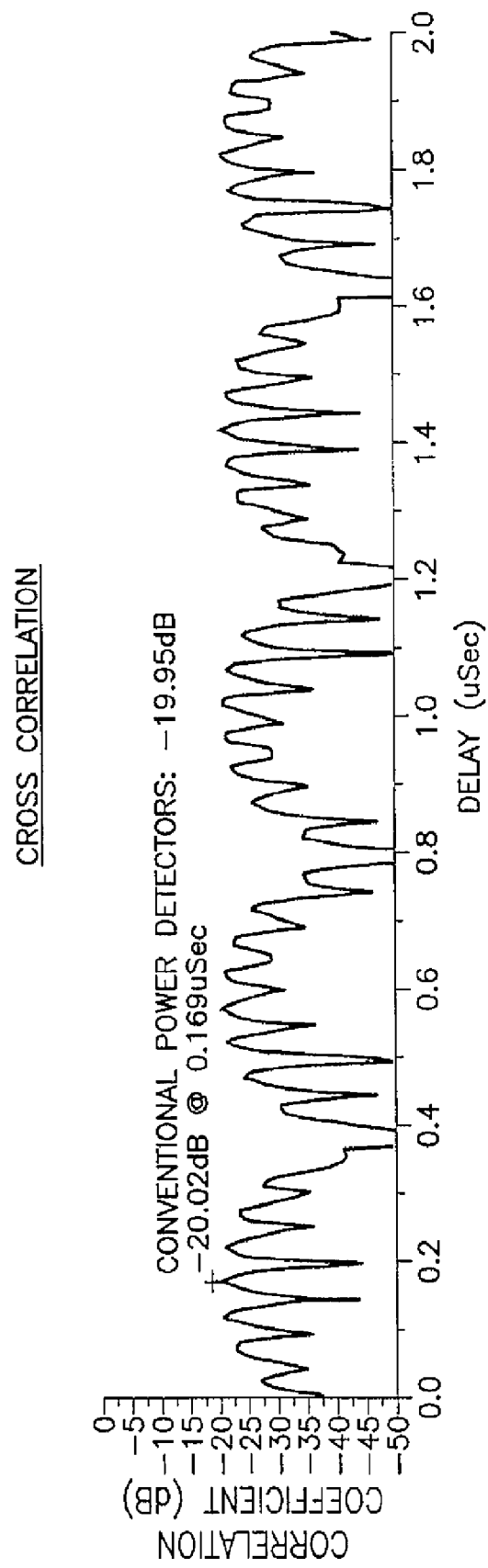
FIG. 5C is a chart of cross correlation results for the forward and reflected signals illustrated in FIGS. 5A and 5B.

As a demonstration of the capabilities, consider the following. First, transmit two CW carriers at equal power into an antenna load that has a 20 dB return loss. FIG. 5A is a frequency spectrum chart and FIG. 5B is a time domain chart of a forward RF signal 335-2 and a reflected signal 355 for a 20 dB antenna load without interference. FIG. 5C is a chart of cross correlation results 371 for the forward and reflected signals illustrated in FIGS. 5A and 5B. It can be seen by FIG. 5C that an exemplary embodiment of the instant invention determines a −20.02 dB (at 0.169 μsec) return loss estimate in dB, which is very close to the 20 dB antenna load.

Figure 6A:
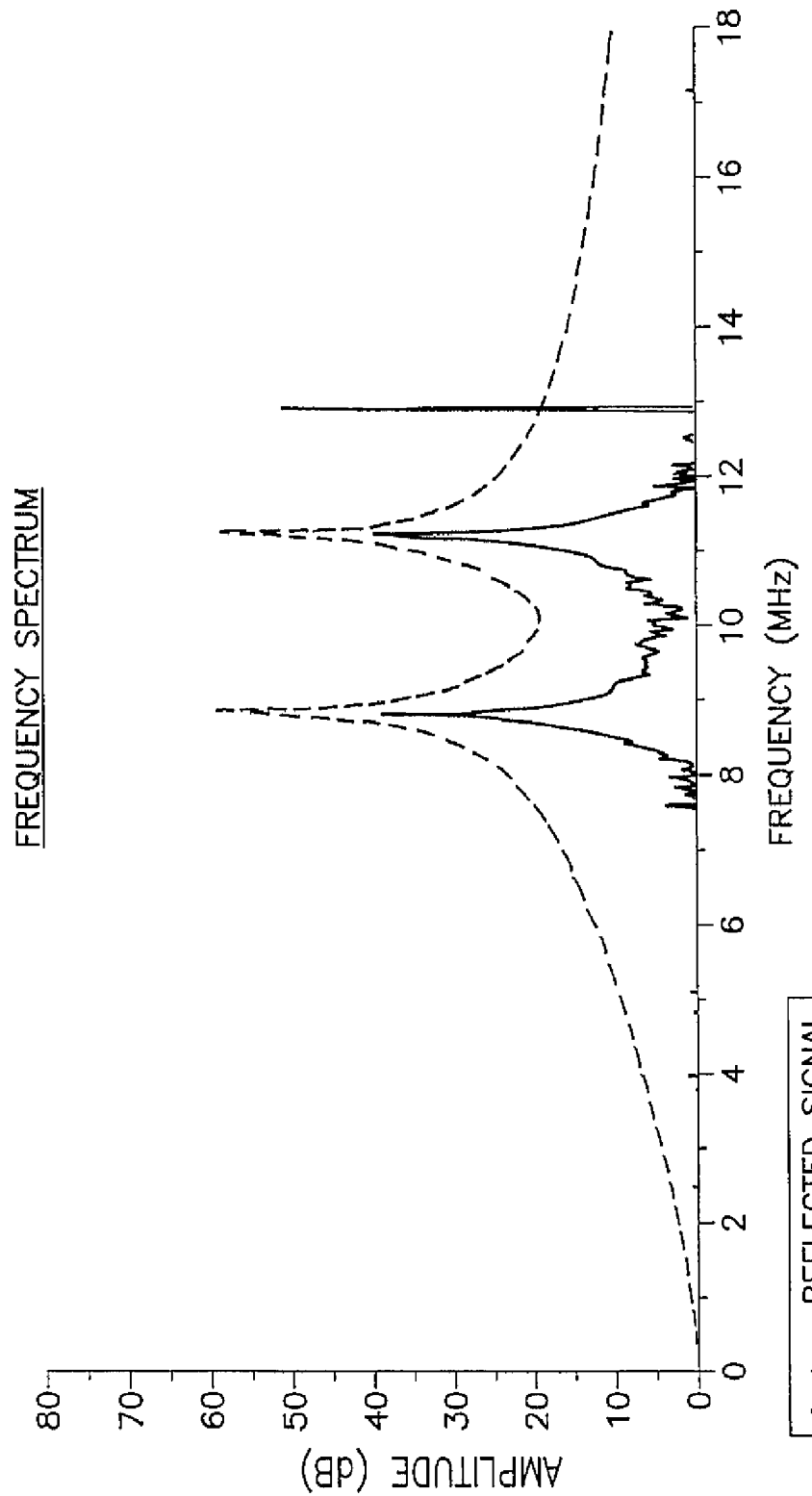
FIG. 6A is a frequency spectrum chart and FIG. 6B is a time domain chart of forward and reflected signals for a 20 dB antenna load and 0 dB isolation with interference.
Figure 6B:
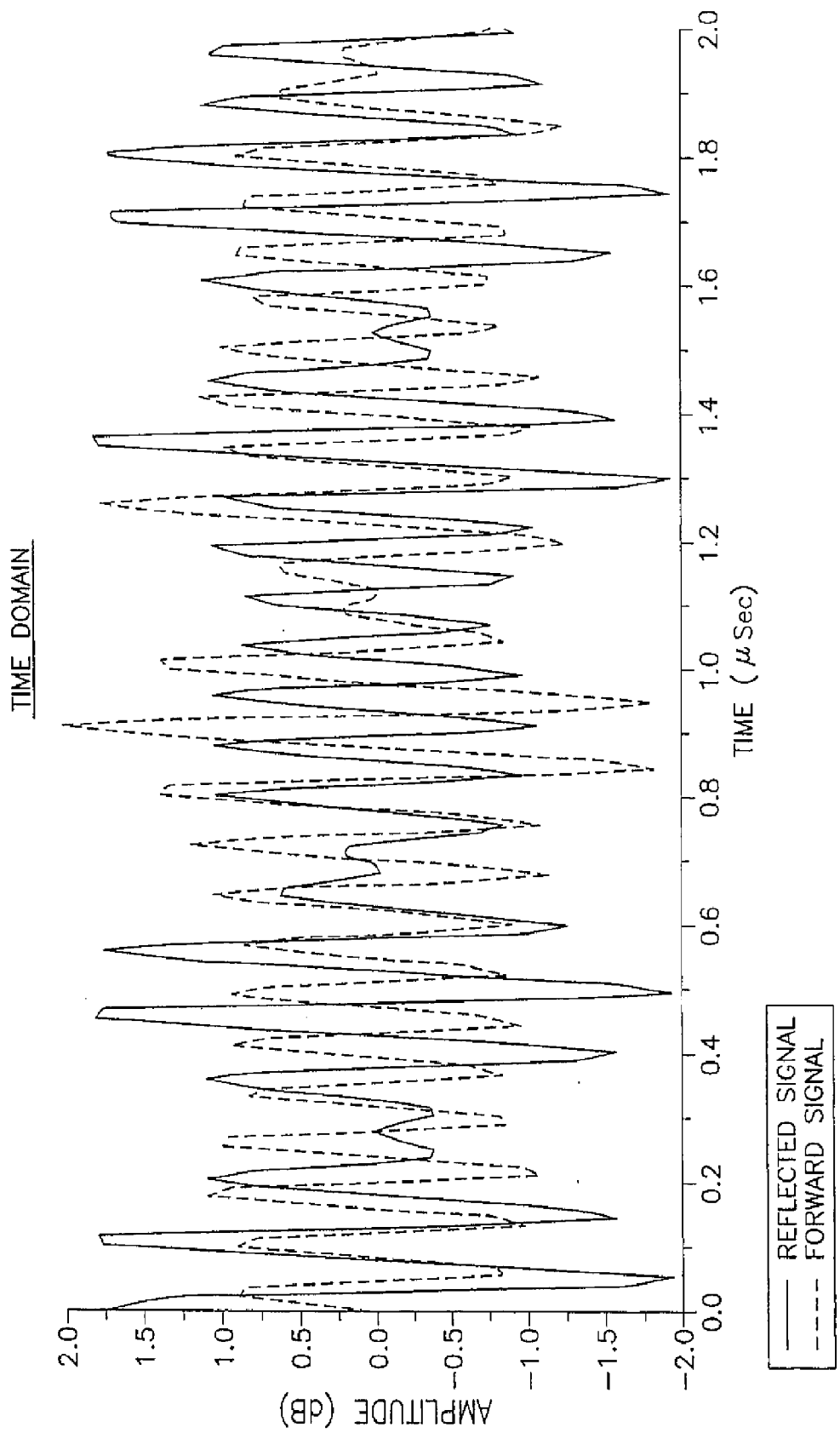
Figure 6C:
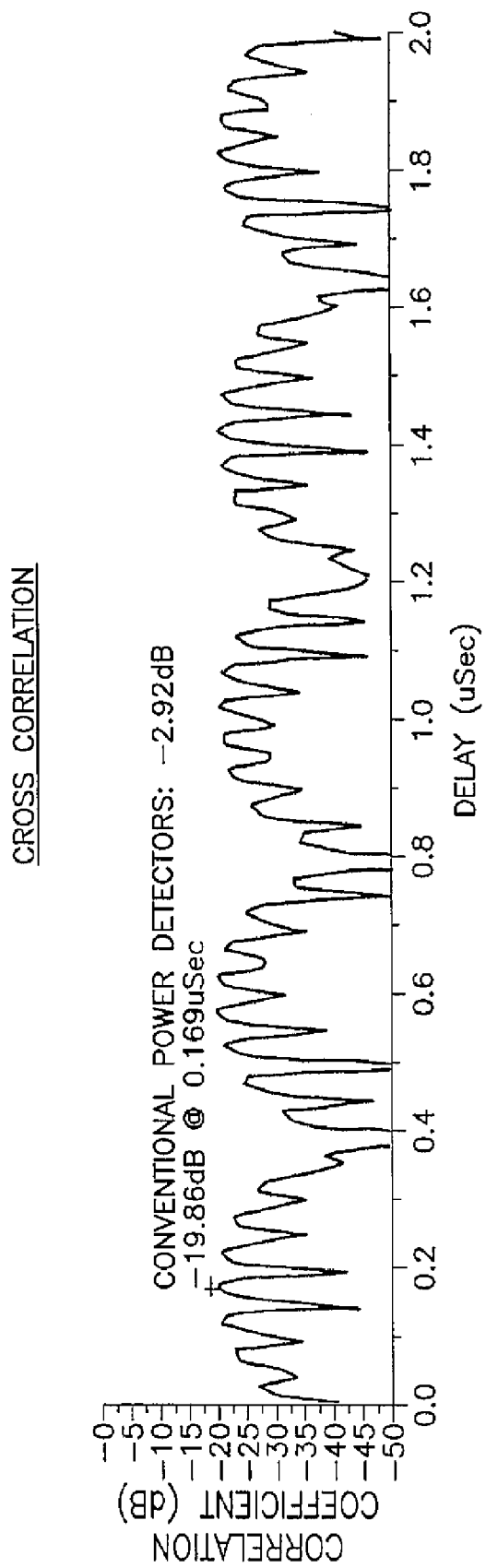
FIG. 6C is a chart of cross correlation results for the forward and reflected signals illustrated in FIGS. 6A and 6B.

Consider now the same situation but with an interfering carrier added. The interfering carrier is at the same power level as the desired carriers, which is equivalent to 0 dB of isolation. The interfering carrier may be assumed to be, e.g., caused by a co-sited base station such as an eNB. FIGS. 6A, 6B, and 6C illustrate this example. FIG. 6A is a frequency spectrum chart and FIG. 6B is a time domain chart of forward and reflected signals for a 20 dB antenna load and 0 dB isolation with interference, and FIG. 6C is a chart of cross correlation results for the forward and reflected signals illustrated in FIGS. 6A and 6B. The extent of the interference is evident from the spectral chart (FIG. 6A) and from the time domain chart (FIG. 6B), where the interference is clearly swamping out the desired signals. In fact, conventional power detectors would report a 2.9 dB return loss although the return loss is really 20 dB. This would be a false alarm. But, using the apparatus and techniques disclosed herein, the error is reduced to only approximately 0.2 dB (that is, 20 dB actual return loss minus the 19.86 dB estimated return loss, or about 0.2 dB).

Figure 7A:
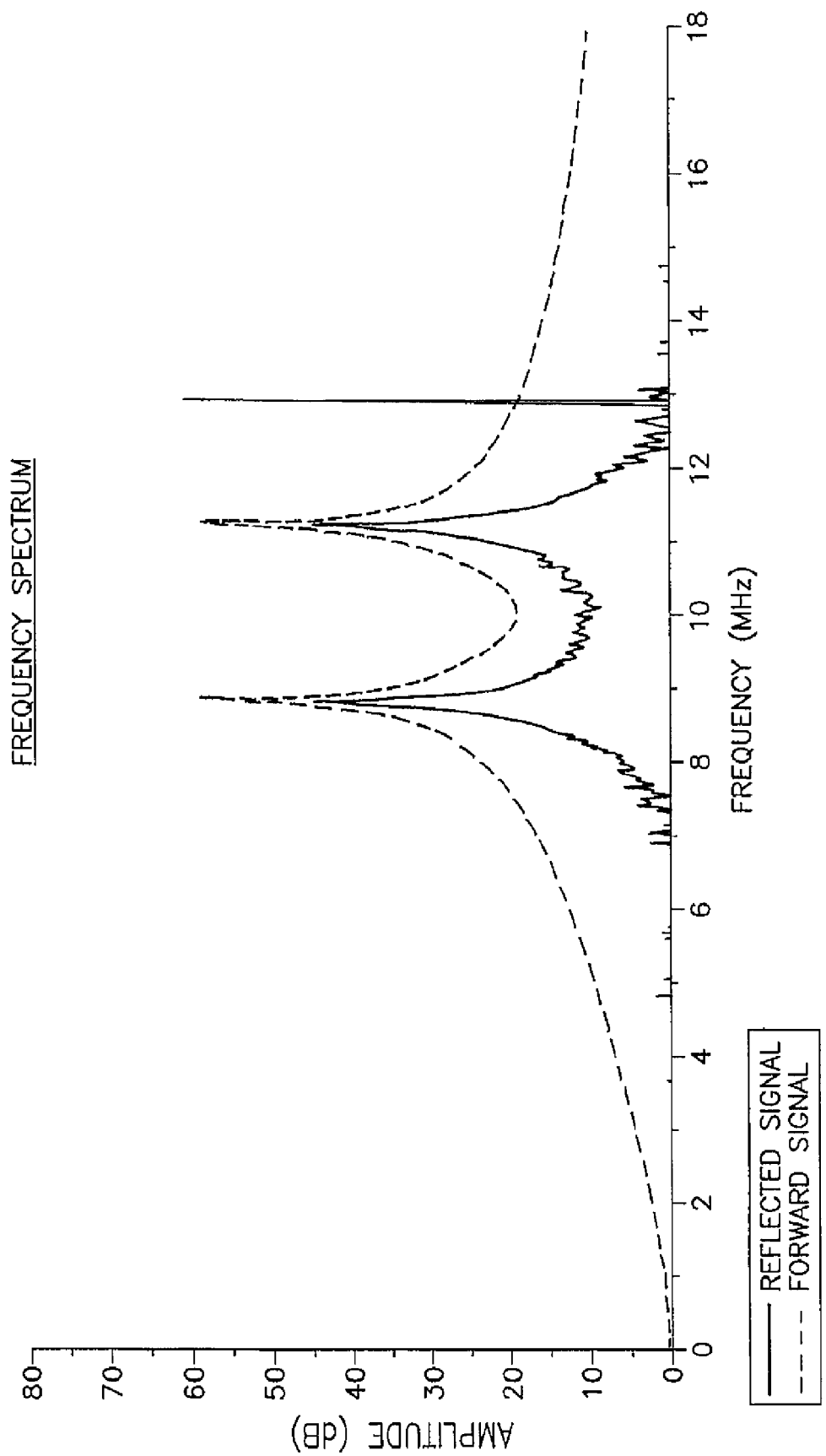
FIG. 7A is a frequency spectrum chart and FIG. 7B is a time domain chart of forward and reflected signals for a 14 dB antenna load and 0 dB isolation with interference.
Figure 7B:
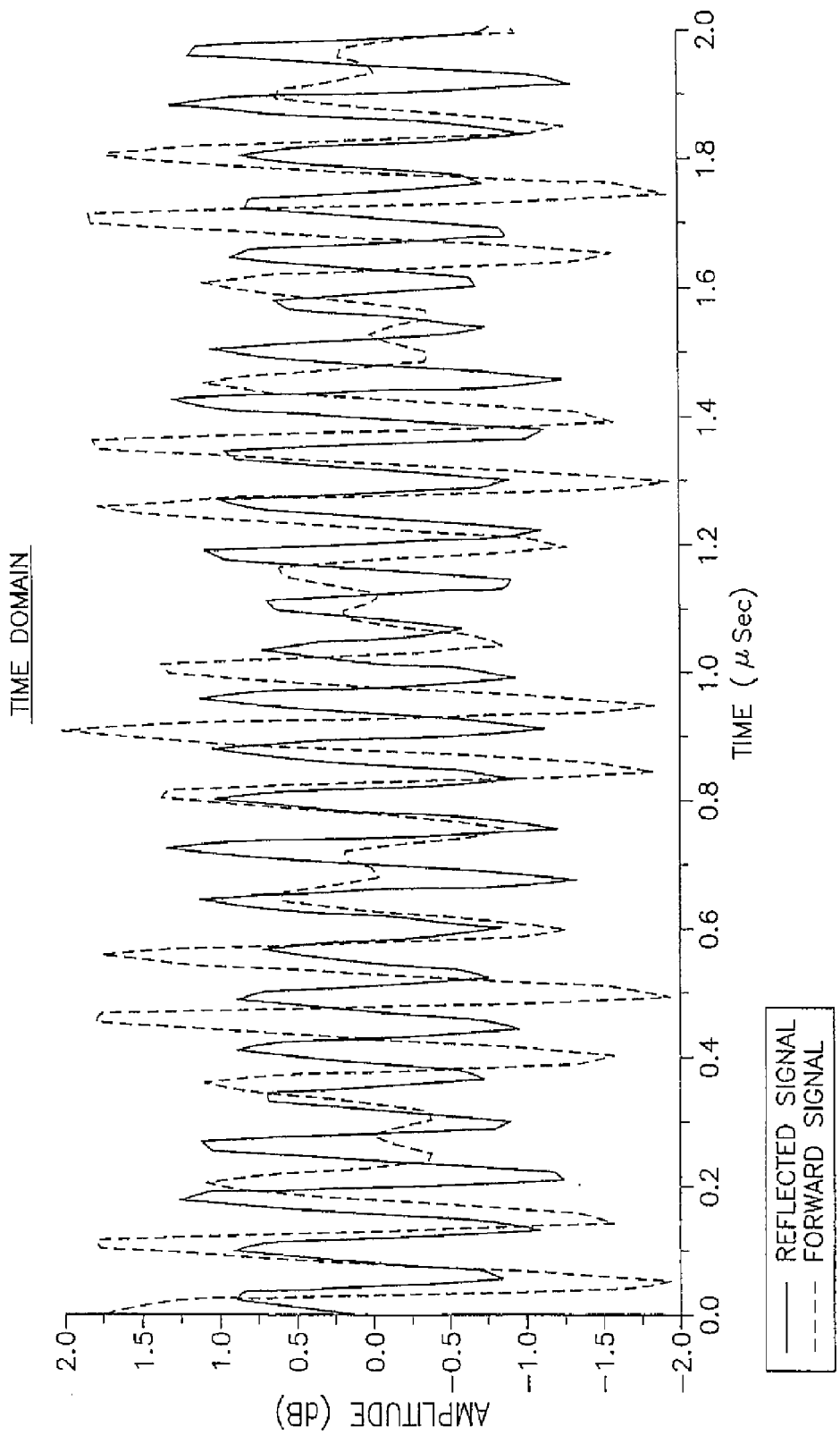
Figure 7C:
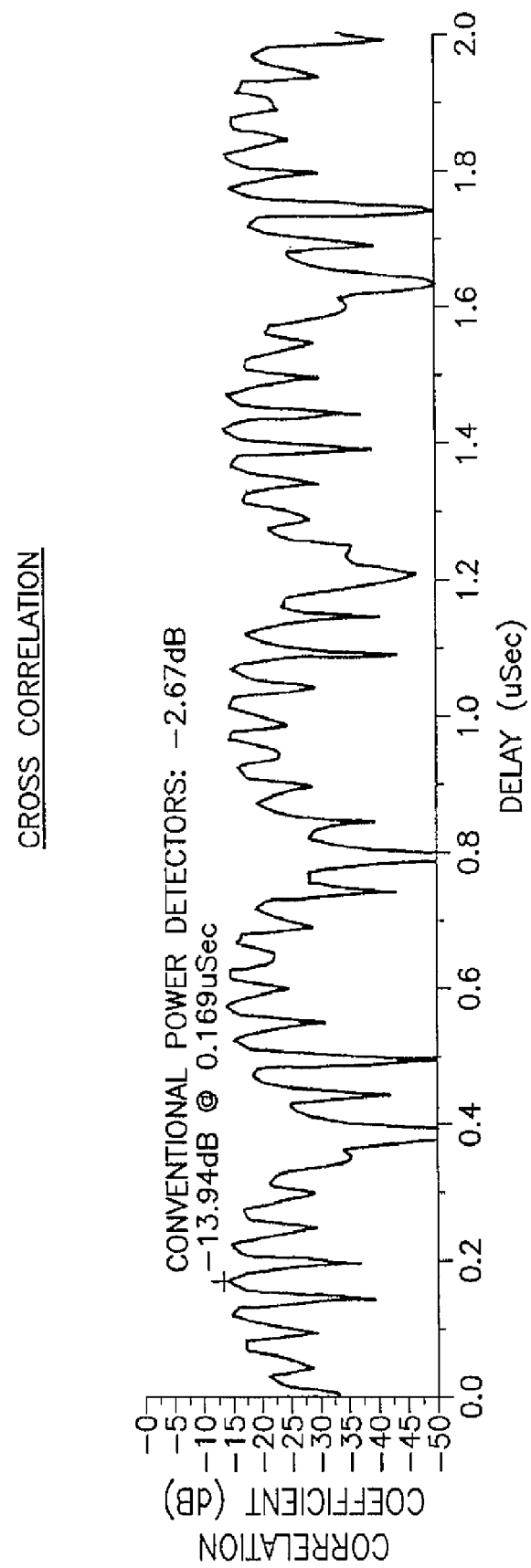
FIG. 7C is a chart of cross correlation results for the forward and reflected signals illustrated in FIGS. 7A and 7B.

At a load return loss of 14 dB, which is more typical of the most sensitive alarm threshold, the error is roughly 0.1 dB as shown in FIG. 7C (i.e., 14 dB actual return loss minus the 13.94 dB estimated return loss). And, for lower return loss, the error reduces further. See FIGS. 7A, 7B, and 7C, where FIG. 7A is a frequency spectrum chart and FIG. 7B is a time domain chart of forward and reflected signals for a 14 dB antenna load and 0 dB isolation with interference, and FIG. 7C is a chart of cross correlation results for the forward and reflected signals illustrated in FIGS. 7A and 7B.

Embodiments of the present invention may be implemented in software (executed by one or more processors), hardware (e.g., an application specific integrated circuit), or a combination of software and hardware. In an example embodiment, the software (e.g., application logic, an instruction set) is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer, with one example of a computer described and depicted, e.g., in FIG. 1. A computer-readable medium may comprise a computer-readable storage medium (e.g., memory(ies) 155 or other device) that may be any media or means that can contain or store the instructions for use by or in connection with an instruction execution system, apparatus, or device, such as a computer.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

The following abbreviations that may be found in the specification and/or the drawing figures are defined as follows:
ADC Analog-to-Digital Converter
ASIC Application-Specific Integrated Circuit
CDMA Code Division Multiple Access
CW Continuous Wave
dB decibel
eNB evolved Node B (e.g., LTE base station)
FFT Fast-Fourier Transform
IC Integrated Circuit
LTE Long Term Evolution
Msps Megasamples per second
PA Power Amplifier
RF Radio Frequency
RL Return Loss
Rx Reception or Receiver
Tx Transmission or Transmitter
VSWR Voltage Standing Wave Ratio

What is claimed is:

1. A method, comprising
accessing a plurality of sets of correlation values, each set of correlation values corresponding to a correlation performed between a number of first samples and a same number of second samples, the sets of correlation values determined by aligning the number of the first samples with a selected set of the second samples and then sliding the number of first samples across the second samples to select different sets of the second samples, wherein the first samples are samples of a forward signal transmitted over a cable/connector system to one or more antennas and the second samples are samples of a reflected radio frequency signal that comprises a reflected version of the forward signal;
determining a maximum value from the plurality of sets of correlation values; and
associating the maximum value with a return loss of the cable/connector system.

2. The method of claim 1, wherein the reflected radio frequency signal is a reflected version of a radio frequency version of the forward signal, wherein reflections occur at least by one or both of the cable/connector system or the one or more antennas.

3. The method of claim 1, further comprising determining the plurality of sets of correlation values at least by performing a correlation for the number of the first samples that is aligned with the selected set of the second samples, and performing a correlation for the number of the first samples and each different set of second samples selected by sliding the number of first samples across the second samples.

4. The method of claim 3, wherein the number of first samples is aligned with the selected set of samples by setting a first index in a first memory of a beginning of the number of first samples to align with a second index in a second memory, of a beginning of the selected set of the second samples.

5. The method of claim 4, wherein sliding is performed by modifying the second index for each of the different sets of second samples.

6. The method of claim 4, wherein the sliding is performed by starting at a zero delay for the second samples and ending at a maximum delay for the second samples, each of the delays corresponding to an index in the second samples.

7. The method of claim 6, wherein the maximum delay is determined at least by a value of twice an antenna cable length in the cable/connector system divided by a velocity of propagation of the forward radio frequency signal in the cable.

8. The method of claim 1, further comprising sampling the first samples in a transmission path from baseband to one or more antennas and sampling the second samples in the transmission path.

9. The method of claim 8, further comprising sampling the cable/connector system at a number of samples per second in order to determine at least the second samples.

10. The method of claim 8, further comprising storing a first set of M samples as the first samples and storing a second set of P samples as the second samples, and wherein the number of first samples is Z, where Z is less than the smallest of M and P.

11. The method of claim 1, wherein the associating further comprises converting the maximum value to a decibel value indicative of the return loss of the cable/connector system.

12. The method of claim 1, further comprising determining an alarm should occur based on the return loss and outputting an indication of the alarm.

13. A non-transitory computer readable medium storing a program of instructions, execution of which by a processor configures an apparatus to perform the method according to claim 1.

14. The non-transitory computer readable medium according to claim 13, wherein the non-transitory computer readable medium is a portable medium configured for insertion into a memory slot.

15. An apparatus, comprising:
a memory comprising a plurality of sets of correlation values, each set of correlation values corresponding to a correlation performed between a number of first samples and a same number of second samples, the sets of correlation values determined by aligning the number of the first samples with a selected set of the second samples and then sliding the number of first samples across the second samples to select different sets of the second samples, wherein the first samples are samples of a forward signal transmitted over a cable/connector system to one or more antennas and the second samples are samples of a reflected radio frequency signal that comprises a reflected version of the forward signal; and
circuitry configured to perform at least the following:
determining a maximum value from the plurality of sets of correlation values; and
associating the maximum value with a return loss of the cable/connector system.

16. The apparatus of claim 15, wherein the reflected radio frequency signal is a reflected version of a radio frequency version of the forward signal, wherein reflections occur at least by one or both of the cable/connector system or the one or more antennas.

17. The apparatus of claim 15, further comprising circuitry configured to perform determining the plurality of sets of correlation values at least by performing a correlation for the number of the first samples that is aligned with the selected set of the second samples, and to perform performing a correlation for the number of the first samples and each different set of second samples selected by sliding the number of first samples across the second samples.

18. The apparatus of claim 17, wherein the number of first samples is aligned with the selected set of samples by setting a first index in a first memory of a beginning of the number of first samples to align with a second index in a second memory of a beginning of the selected set of the second samples.

19. The apparatus of claim 18, wherein sliding is performed by modifying the second index for each of the different sets of second samples.

20. The apparatus of claim 18, wherein the sliding is performed by starting at a zero delay for the second samples and ending at a maximum delay for the second samples, each of the delays corresponding to an index in the second samples.

* * * * *